US006552276B2

(12) United States Patent
Korem

(10) Patent No.: US 6,552,276 B2
(45) Date of Patent: Apr. 22, 2003

(54) BOARD INTEGRATED RESILIENT CONTACT ELEMENTS ARRAY AND METHOD OF FABRICATION

(75) Inventor: Aharon Korem, Herzliya (IL)

(73) Assignee: Aprion Digital Ltd., Netanya (IL)

(*) Notice: Subject to any disclaimer, the term of this patent is extended or adjusted under 35 U.S.C. 154(b) by 0 days.

(21) Appl. No.: 10/000,010

(22) Filed: Dec. 4, 2001

(65) Prior Publication Data

US 2002/0066590 A1 Jun. 6, 2002

Related U.S. Application Data

(60) Provisional application No. 60/251,036, filed on Dec. 5, 2000.

(51) Int. Cl.[7] .................................................. H01R 9/09
(52) U.S. Cl. ........................................ 174/261; 439/81
(58) Field of Search ................................ 174/261, 260; 439/74, 81, 591; 361/760, 767

(56) References Cited

U.S. PATENT DOCUMENTS

| 5,263,867 | A | * | 11/1993 | Doi et al. ..................... 439/81 |
| 6,056,557 | A | | 5/2000 | Crotzer et al. |
| 6,184,580 | B1 | * | 2/2001 | Lin ............................. 257/712 |
| 6,241,561 | B1 | * | 6/2001 | Zebermann et al. ........ 439/716 |
| 6,280,207 | B1 | * | 8/2001 | Sakata et al. ............... 439/591 |

FOREIGN PATENT DOCUMENTS

EP        0725459 A2  *  8/1996

* cited by examiner

Primary Examiner—Albert W. Paladini
(74) Attorney, Agent, or Firm—Eitan, Pearl, Latzer & Cohen-Zedek

(57) ABSTRACT

According to some embodiments of the present invention, a connectable electronic component-carrying board is provided. The connectable electronic board comprises at least one resilient conductive element integrally molded onto at least part of a contact of the connectable board. The resilient conductive element is able to provide an electrical pathway between the contact it is molded to and a corresponding contact on another electronic component-carrying board. A method of fabricating the connectable electronic component-carrying board is also provided.

15 Claims, 3 Drawing Sheets

BOARD INTEGRATED RESILIENT CONTACT ELEMENTS ARRAY AND METHOD OF FABRICATION

CROSS-REFERENCE TO RELATED APPLICATIONS

The present application claims priority from U.S. provisional application Ser. No. 60/251,036, filed Dec. 5, 2000.

BACKGROUND OF THE INVENTION

Electrical connectors for connecting a contact of a board, such as an integrated circuit board, to a corresponding contact of another board are known in the electronics industry. An example of such a connector is an interconnect-socket comprising an isolating rigid substrate having resilient conductive elements disposed in a desired array to provide electrical connection between the substrate surfaces, During assembly, the socket is stacked between the printed circuit boards. The printed circuit board contact pads align with the interconnect-socket conductive elements, force is applied to the printed circuit boards and the interconnect-socket and circuit boards are secured together.

The manufacturing of the interconnect-socket involves complicated high-pressure injection molding techniques. The assembly also requires delicate adjusting and aligning of the conductive elements to both circuit boards. It would be advantageous to provide connecting means between electronic component carrying boards and a method of fabrication thereof, which simplifies the design configuration and fabrication of electrical connection between electronic component carrying boards.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which.

Figure 1:
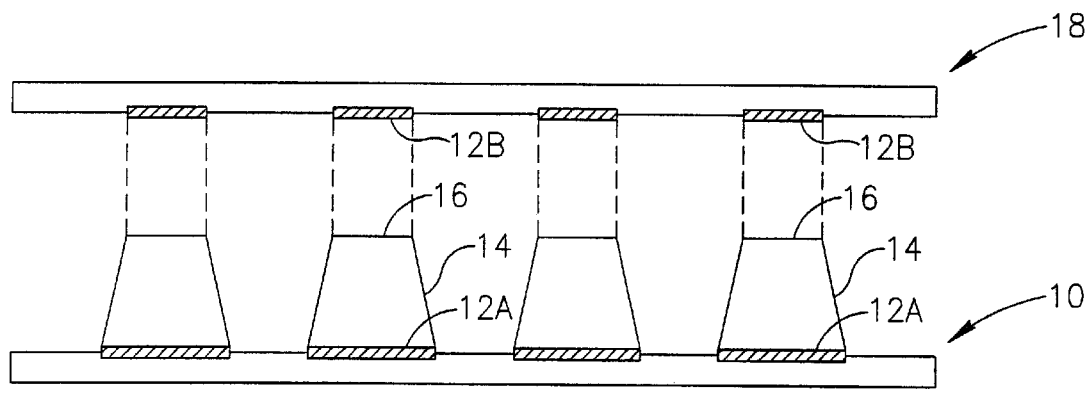
FIG. 1 is an enlarged side view of an electronic component-carrying board with integrally molded contact elements connectable to another electronic plane according to some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Some embodiments of the present invention are directed to resilient conductive contact elements integrally molded onto contacts of a first electronic board. Each element is able to provide an electrical pathway between a contact on the board it is molded to and a corresponding contact on a second electronic board.

Reference is now made to FIG. 1, which illustrates a connectable electronic component-carrying board with integrally molded contact elements that are connectable to another electronic component-carrying board according to some embodiments of the present invention. Non-limiting examples of an electronic component-carrying board include a printed circuit board, a ground plate, a conductive board comprising piezoelectric elements, and an insulating board comprising piezoelectric elements. These board may be a part of an inkjet head device.

A rigid electronic component-carrying board 10 may comprise one or more electrical contacts 12A and one or more resilient conductive elements 14. Each element 14 may be integrally molded onto a respective electrical contact 12A. Conductive elements 14 may comprise a mixture of a moldable elastomeric material, such as, for example, a room temperature vulcanized (RTV) silicone adhesive-sealant mixed with small conductive particles. Such a mixture is available from Tecknit of Cranford, N.J., USA.

Conductive element 14 may comprise an upper contact area 16. A second electronic component-carrying board 18 having one or more corresponding electrical contacts 12B may be connectable to electronic board 10. When connecting, at least a portion of contacts 12B may be positioned to abut a corresponding upper contact area 16 of conductive element 14 so that an electrical pathway between corresponding contacts 12A and 12B is provided. It should be noted that since element 14 is permanently attached to contact 12A, area 16 is the only floating surface connecting corresponding contacts 12A and 12B.

In order to achieve a desired conductivity via resilient elements 14, pressure may be applied until a satisfactory contact between upper area 16 and contact 12B is acquired. The force required to create a satisfactory contact for a single resilient element 14 may be approximately 10–20 grams per element. This, the required force may be approximately 10–20 Kg. for an array of 1000 resilient elements. Other parameters that may determine the required force for connecting electric boards 10 and 18 may include the geometrical characteristics of element 14 and the elastic properties of the material it is made of.

In the exemplary embodiment illustrated in FIG. 1, each conductive element 14 has a generally truncated conical shape. It should be understood to a person skilled in the art, however, that element 14 may have other shapes, such as, for example, a top-rounded pillar shape, a generally elliptical shape flattened at one end and any other suitable shape.

Figure 2:
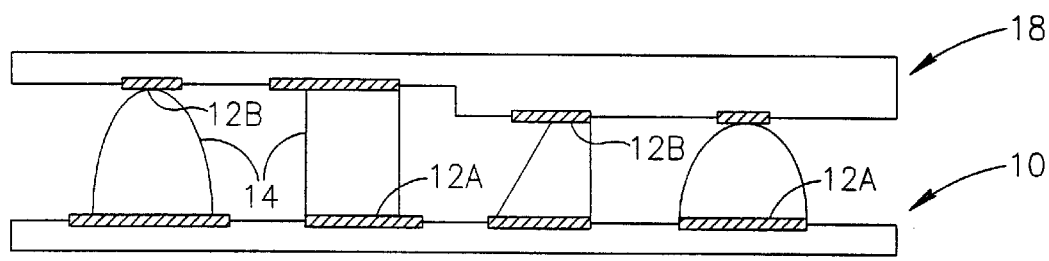
FIG. 2 is an enlarged side view of an electronic component-carrying board with integrally molded contact elements connectable to another electronic plane according to some embodiments of the present invention.

Furthermore, in this exemplary embodiment, the bottom surface of conductive element 14 covers the entire surface of contact 12A. According to some embodiments of the present invention as illustrated in FIG. 2, the bottom surface of element 14 may be integrally molded onto at least a portion of contact 12A, leaving another portion of the contact uncovered. Additionally or alternatively, element 14 may be formed so that upper contact area 16 is connected to at least a portion of contact 12B, leaving another portion of the contact uncovered.

As can be seen in FIG. 2, the height and shape of each element 14 may vary. The distribution, the height and the general shape of each element may be designed as required. These characteristics may depend on the design of second electronic board 18, which is to be connected to electronic board 10.

Figure 3:
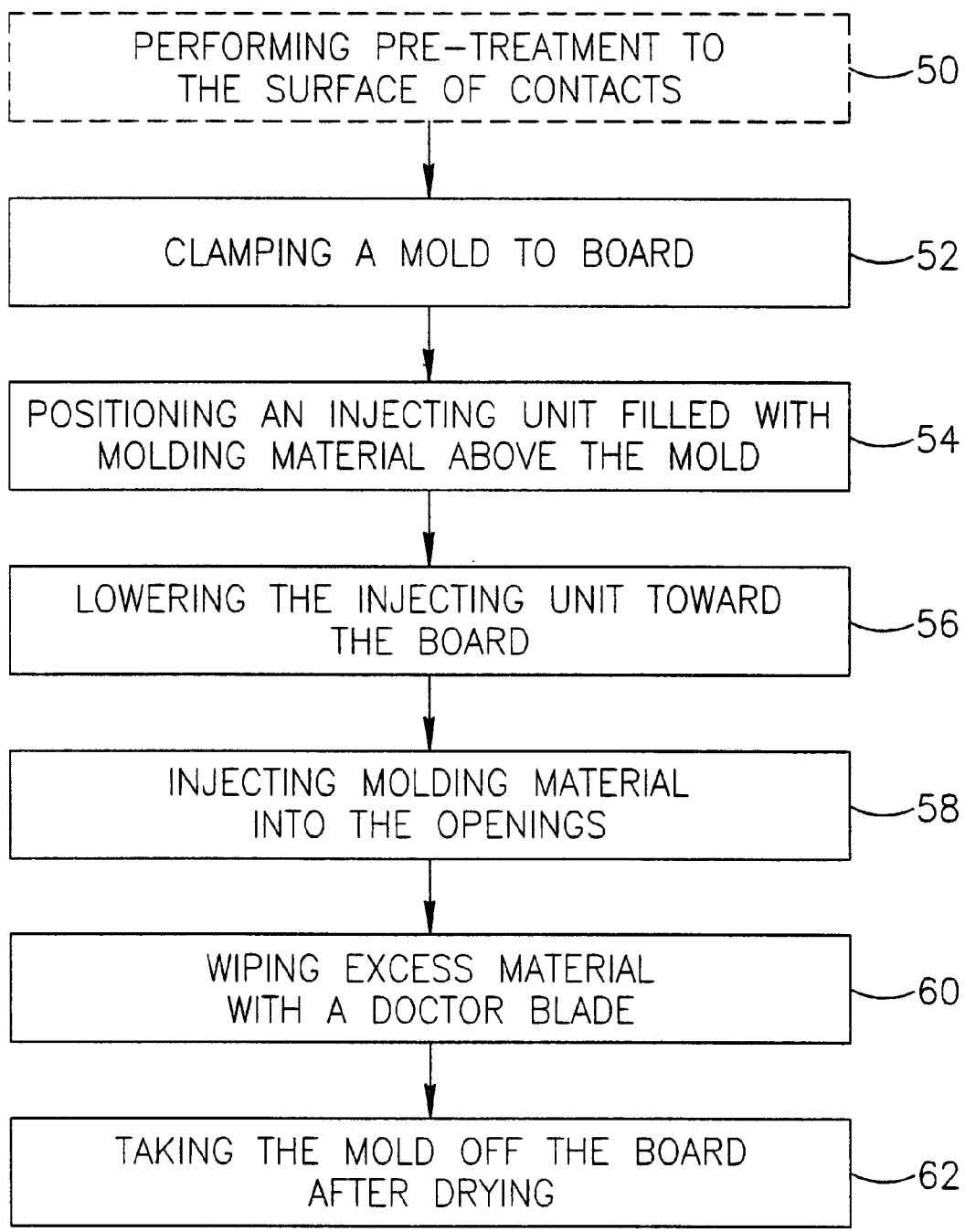
FIG. 3 shows a flow chart diagram representing a method for fabricating an electronic component-carrying board with integrally molded contact elements according to some embodiments of the present invention.
Figure 4:
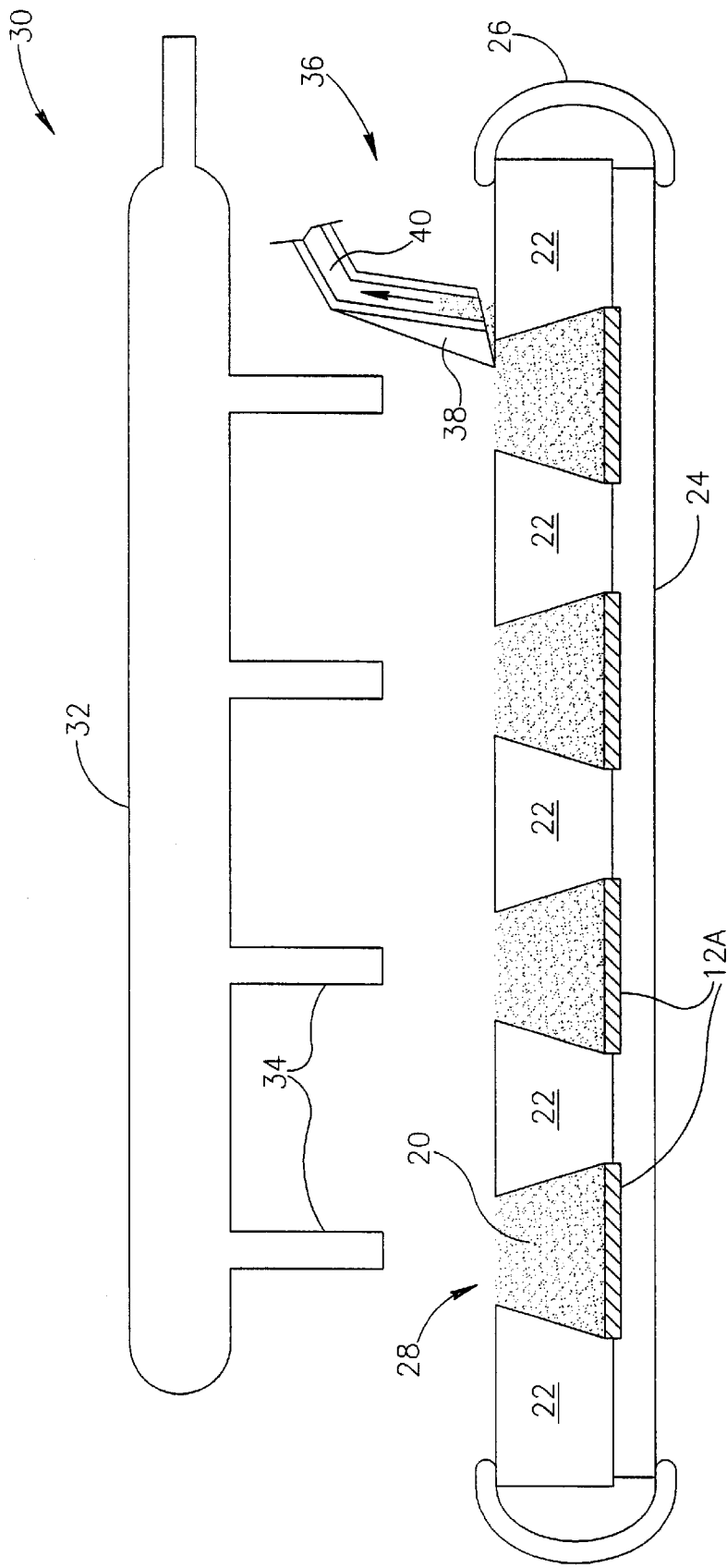
FIG. 4 shows an illustration representing the method of FIG. 3.

Reference is now made to FIG. 3, which is a flow chart representing a method for fabricating an electronic component-carrying board with integrally molded contact elements according to some embodiments of the present invention. Reference is also made to FIG. 4, which illustrate the method of FIG. 3.

Optionally, at first, a pre-treatment process may be applied to the surface of contacts 12A. Non-limiting examples of a pre-treatment process include abrasion and applying a primer to the surface, for example SCOTCH WELD 3901 primer available from 3M of Minneapolis, Minn., USA (step 50). The pre-treatment process may increase the adhesion of a molding material 20 to electrical contacts 12. Molding material 20 may be an RTV silicon adhesive-sealant mixed with silver particles, which is conductive and adherent to conductive materials, such as gold and piezoelectric materials.

A mold 22 may then be clamped to a rigid electronic component-carrying board 24 having contacts 12A using a clamping device 26 (step 52). Mold 22 may comprise one or more openings 28, which are positioned so that when mold 22 is clamped to board 24, each opening is located above a corresponding contact 12A. Openings 28 may be structurally created according to the desired shape of elements 14 and may comprise a pattern matching the location of contacts 12A on board 24.

Mold 22, particularly the surface of the walls surrounding openings 28, may be made of a material repellent to molding material 20, such as, for example TEFLON. Such a material may enable removal of the mold once molding material 20, which is injected into openings 28 in a form of a paste, has dried, without any damage to the molded elements 14.

An injecting unit 30 filled with molding mixture 20 may be positioned above mold 22 (step 54), Injecting unit 30 may comprise a body 32 and one or more injectors 34 connected to body 32. Injecting unit 30 may then be lowered toward mold 22 so that each injector 34 is positioned within a respective opening 28 (step 56). Molding material 20 may be injected into openings 28 by applying pressure to injecting unit 30 while slowly lifting it up to prevent air bubbles (step 58).

Next, injectors 34 may be removed from the vicinity of openings 28. The final step before dying is a cleaning operation. Excess mixture, which may overload and spill out of the openings, may be removed using a doctor blade 36 (step 60). Doctor blade 36, which is a wiping knife, may comprise a wiper 38 and a sucking member 40 for sucking off excess mixture 20 from openings 28. The wiping may enable conductive elements 14 to acquire a desired shape according to the structure of opening 28. Next the mixture may be dried and mold 22 may be taken off board 24 (step 62) leaving conductive elements 14 integrally molded onto the board.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A connectable electronic component-carrying board comprising:

one or more resilient conductive elements, said conductive elements comprise a resilient material mixed with small conductive particles, each of said conductive elements integrally molded onto at least part of a respective contact of said connectable electronic component-carrying board and able to provide an electrical pathway between said contact and a corresponding contact on another electronic component-carrying board.

2. The connectable electronic component-carrying board of claim 1, wherein said connectable electronic component-carrying board is a printed circuit board.

3. The connectable electronic component-carrying board of claim 1, wherein said connectable electronic component-carrying board is a ground plate.

4. The connectable electronic component-carrying board of claim 1, wherein said connectable electronic component-carrying board is a part of ink jet device.

5. The connectable electronic component-carrying board of claim 1, wherein said contact of said connectable electronic component-carrying board is a piezoelectric element.

6. The connectable electronic component-carrying board of claim 5, wherein said connectable electronic component-carrying board is a part of ink jet device.

7. The electronic component-carrying board of claim 1, wherein at least one of said conductive elements has a generally conical shape having a truncated portion.

8. The electronic component-carrying board of claim 1, wherein at least one of said conductive elements has a generally elliptical shape flattened at one end.

9. The electronic component-carrying board of claim 1, wherein a first and second of said conductive elements have different heights.

10. The electronic component-carrying board of claim 1, wherein a first and second of said conductive elements are structurally different from each other.

11. An inkjet device comprising:

an electronic board having piezoelectric elements;

one or more resilient conductive element each integrally molded onto a respective one of said piezoelectric elements and able to provide an electrical pathway between said respective one of said piezoelectric elements and a corresponding contact on an electronic component-carrying board.

12. A method of fabricating a connectable electronic component-carrying board comprising:

clamping a mold having one or more openings onto an electronic component-carrying board so that each of said openings is placed above at least part of a contact of said electronic component-carrying board; and injecting a resilient conductive material from an injector unit having one or more injectors located above or within said openings, said material being adherent to said contact when dry.

13. The method of claim 12 further comprising:

moving a doctor blade over a top surface of said mold to remove an excess of said material.

14. The method of claim 13 wherein said removing comprising sucking off said excess of said material.

15. A method of fabricating a connectable electronic component-carrying board comprising:

clamping a mold having one or more openings onto an electronic component-carrying board so that each of said openings is placed above at least part of a contact of said electronic component-carrying board; and injecting a resilient conductive material from an injector unit having one or more injectors located above or within said openings; and moving a doctor blade over a top surface of said mold to remove an excess of said material, said material being adherent to said contact when dry.

* * * * *